United States Patent [19]
Tanaka et al.

[11] Patent Number: 5,837,567
[45] Date of Patent: Nov. 17, 1998

[54] LEAD FRAME AND SEMICONDUCTOR DEVICE

[75] Inventors: Naotaka Tanaka; Akihiro Yaguchi, both of Ibaraki-ken; Makoto Kitano, Tsuchiura; Tatsuya Nagata, Ishioka; Tetsuo Kumazawa, Ibaraki-ken; Atsushi Nakamura, Fuchu; Hiromichi Suzuki, Machida; Masayoshi Tsugane, Kodaira, all of Japan

[73] Assignee: Hitachi, Ltd., Tokyo, Japan

[21] Appl. No.: 829,230

[22] Filed: Mar. 31, 1997

Related U.S. Application Data

[62] Division of Ser. No. 438,467, May 10, 1995, Pat. No. 5,637,914.

[30] Foreign Application Priority Data

May 16, 1994 [JP] Japan ................................. 6-100444

[51] Int. Cl.⁶ .................................................. H01L 21/44
[52] U.S. Cl. ........................................... 438/123; 438/121
[58] Field of Search ................................... 438/121, 122, 438/123, 124

[56] References Cited

U.S. PATENT DOCUMENTS

| | | | |
|---|---|---|---|
| 5,258,331 | 11/1993 | Masumoto et al. | 438/123 |
| 5,336,564 | 8/1994 | Moldavsky | 438/123 |
| 5,352,633 | 10/1994 | Abbott | 438/123 |
| 5,422,313 | 6/1995 | West | 438/123 |
| 5,432,127 | 7/1995 | Lamson et al. | 438/123 |

FOREIGN PATENT DOCUMENTS

| | | |
|---|---|---|
| 6489354 | 4/1989 | Japan . |
| 01187842 | 7/1989 | Japan . |
| 02122660 | 5/1990 | Japan . |
| 02220468 | 9/1990 | Japan . |
| 02310955 | 12/1990 | Japan . |
| 0434195 | 6/1991 | Japan . |
| 04091464 | 3/1992 | Japan . |
| 04133459 | 5/1992 | Japan . |
| 04206560 | 7/1992 | Japan . |
| 255260 | 9/1992 | Japan . |
| 05013655 | 1/1993 | Japan . |
| 06037126 | 2/1994 | Japan . |
| 06196620 | 7/1994 | Japan . |

*Primary Examiner*—Kevin Picardat
*Attorney, Agent, or Firm*—Antonelli, Terry, Stout & Kraus, LLP

[57] ABSTRACT

A lead frame for use with a plastic encapsulated semiconductor device includes a tab on which the semiconductor chip is mounted, chip pad supporting leads, inner leads to be electrically coupled with the semiconductor chip, outer leads formed in a monoblock structure together with the inner leads, and a frame for supporting the chip pad supporting leads and outer leads. In the lead frame, there is disposed a dam member only between the outer leads. Alternatively, dummy outer leads are formed between the frame and leads adjacent thereto so as to connect the dummy leads to the outer leads by the dam member. The frame is removed after the semiconductor device is assembled.

26 Claims, 17 Drawing Sheets

FIG. IA
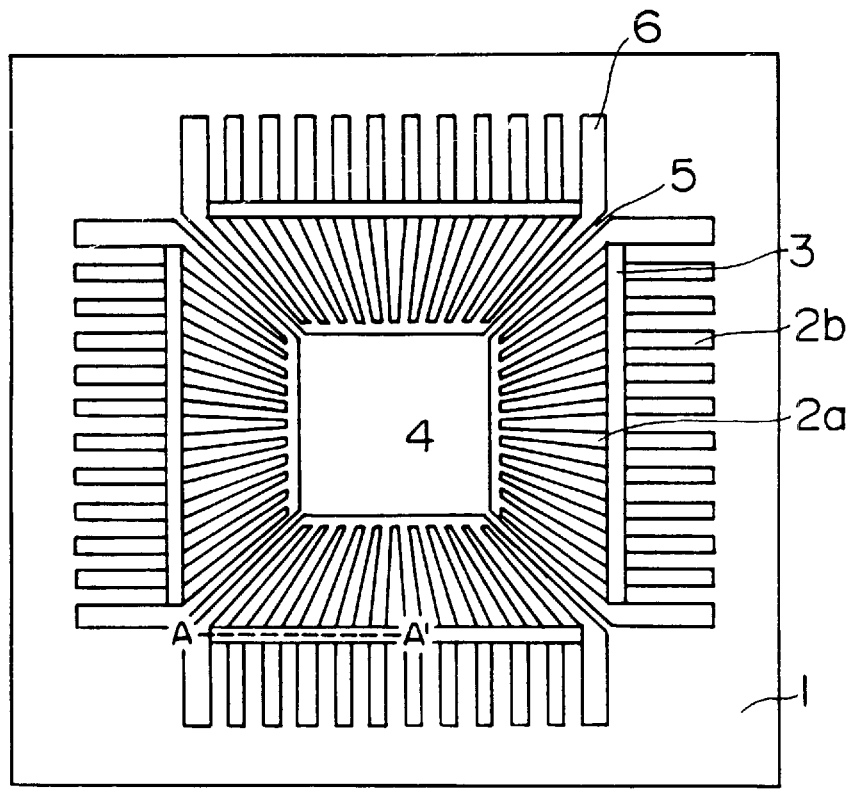
FIG. IB
FIG. IC
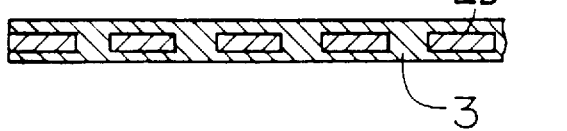

F I G. 5
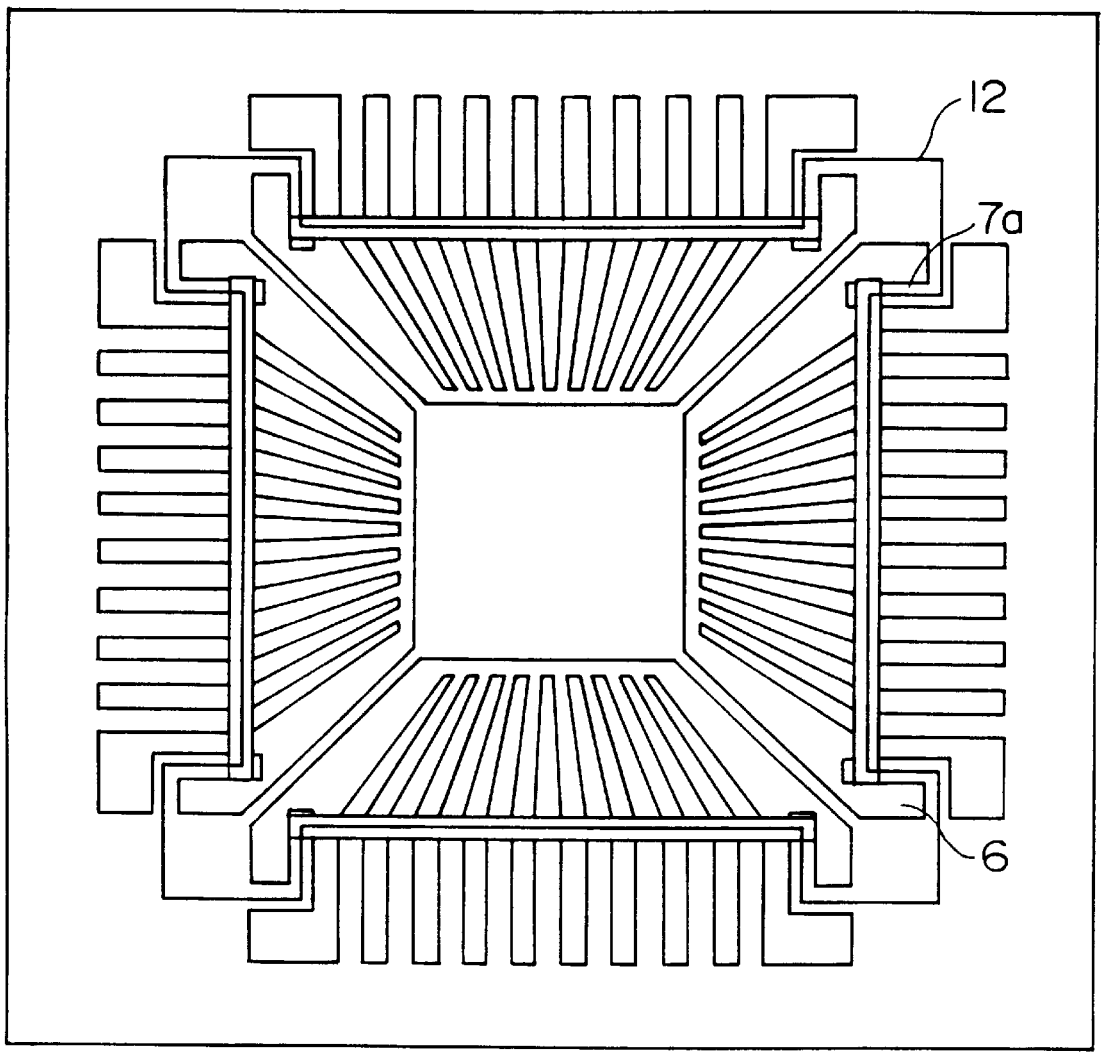

F I G. 11
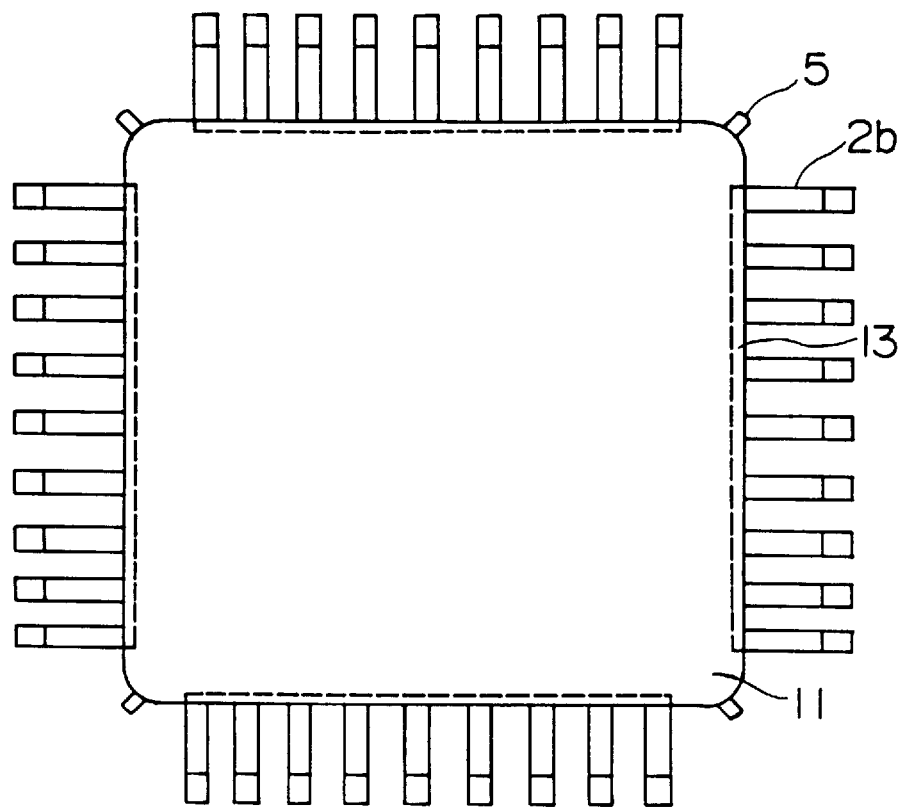

F I G. 12
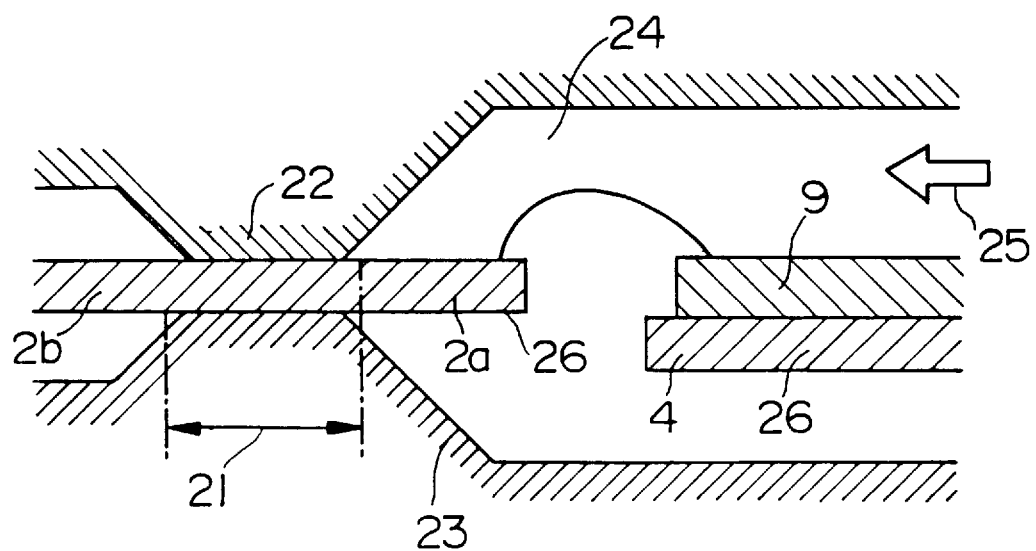

F I G. 14
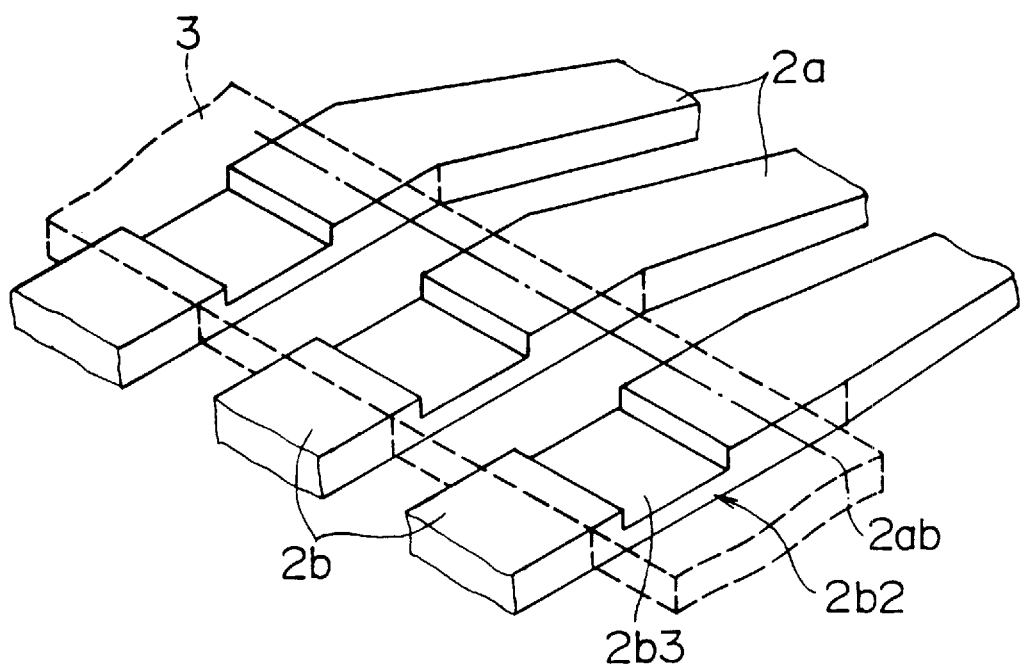

LEAD FRAME AND SEMICONDUCTOR DEVICE

This application is a 37 CFR §1.60 divisional of prior application Ser. No. 08/438,467, filed May 10, 1995 now U.S. Pat. No. 5,637,914.

BACKGROUND OF THE INVENTION

The present invention relates to a technology of producing a lead frame and a technology of configuring a semiconductor device using the lead frame and, in particular, a technology effectively solving problems caused by camber of the lead frame when a dam member is employed in place of a dam bar.

Conventionally, a lead frame includes a dam bar fabricated with the same material together with the lead frame in a monoblock configuration. The dam bar prevents encapsulation resin from flowing toward the outer lead side in the transfer mold process. Since the dam bar is integrally formed in the lead frame, to achieve a cutoff process of the dam bar, it is necessary to conduct a cutting process using a metal mold.

However, recently, due to increasing tendency of capacity of semiconductor devices, the number of pins of a semiconductor device package becomes greater, which necessitates a lead frame of a finer pitch construction having a lead pitch of 0.3 mm to 0.5 mm. This leads to a technological problem that it is difficult to conduct the cutting process of the dam bar by use of a metal mold. Even if the process is conducted, the production cost will be considerably increased. For this problem, to remove the cutoff process using a metal mold, there have been proposed methods of creating a dam bar in which, in place of the forming of the dam bar in the monoblock structure, an insulating tape and a resin are used as members of the dam. Reference is to be made to, for example, the JP-A-58-28841, JP-A-2-122660, JP-A-310955, and JP-A-4-91464.

According to the methods above, the dam bar can be easily formed in a multi-pin lead frame and can be removed after the molding process in a simple process using, for example, an organic solvent. In addition, since the dam bar is fabricated with an insulating material, the process of removing the dam bar may possibly be dispensed with in some cases.

SUMMARY OF THE INVENTION

It is therefore an object of the present invention, to provide a lead frame in a fine pitch configuration capable of considerably minimizing camber of the lead frame by a dam bar including dam members and a semiconductor device using the lead frame.

Another object of the present invention is to provide a lead frame in a fine pitch configuration capable of correctly achieving an outer lead molding process and a semiconductor device using the lead frame.

According to the JP-A-58-28841, the dam bar is fabricated with an insulating tape; whereas, various resins are employed according to the JP-A-2-122660, JP-A-310955, and JP-A-4-91464. The fabrication of the dam bar on a lead frame using an insulating tape or resins requires a pressurized molding process in a high temperature. Since the insulating tape and resins generally have a coefficient of linear expansion larger than that of materials of the lead frame (particularly, Fe—42Ni), the overall lead frame disadvantageously cambers due to the difference in the coefficient of linear expansion therebetween when an adhesive agent or resin is hardened on a surface of the tape.

FIG. 2 shows a conventional example of the lead frame constitution according to the JP-A-58-28841 including a dam member 3 between an outer frame of lead frame 1 and an outer lead 2b adjacent thereto. When the dam member 3 is hardened and is contracted, the outer frame 1 is drawn toward the outer lead 2b connected thereto with the dam member 3. Since the outer frame 1 has higher rigidity, the contraction of the dam member 3 cannot be absorbed by internal deformation of the outer frame, resulting in camber in the overall lead frame.

FIG. 3 shows the lead frame structure of another conventional example according to JP-A-4-91464 including a dam member 3 between a chip pad supporting lead 5 and an outer lead 2b adjacent thereto. Due to high rigidity of the supporting lead 5 with two supporting points, the lead frame is cambered through the similar mechanism as for the case of FIG. 2. Camber in the lead frame disadvantageously causes peeling of a die bonding layer, deformation of the leads after a wire bonding process, and hindrance when transporting the lead frame in a semiconductor manufacturing process.

According to the present invention, there is provided a lead frame and a semiconductor device using the same in which occurrence of camber of the lead frame due to the dam bar formed with the dam member can be remarkably suppressed.

To achieve the objects according to the present invention, when a dam bar is molded with an insulating dam member, only outer leads having low rigidity are linked with each other by the dam member, namely, the outer frame of the lead frame and the chip pad supporting leads each having higher rigidity are not coupled with the dam member. Alternatively, between the outer frame or supporting leads and electric signal leads for electric conduction, there is arranged dummy leads at least including only an outer lead (i.e. not including an inner lead) not requiring electric conduction such that the dummy leads are connected to the electric signal leads via the dam member. The dummy leads are cut away after the resin molding process.

In short, the lead frame is configured as follows according to the present invention. In this specification, a term "dam" indicates a member for preventing, in a resin molding in which a cavity of a metal mold is filled with resin in a semiconductor manufacturing process, the resin from flowing from spaces between leads. Moreover, a term "tab" designates a portion on which a semiconductor chip formed in a lead frame surface is mounted, a term "inner lead" denote a lead portion (excepting the tab) in the resin, and a term "outer lead" represents a lead portion outside the resin.

(1) A lead frame for use with a plastic encapsulated semiconductor device includes a tab on which the semiconductor chip is mounted, chip pad supporting leads to be connected to the tab, a plurality of inner leads to be electrically coupled with the semiconductor chip, outer leads formed in a monoblock structure together with the inner leads, a frame for supporting the chip pad supporting leads and the outer leads and being cut away after the semiconductor device is assembled, and a dam member made of an insulating material and disposed only between the outer leads for preventing a sealing resin from flowing out.

(2) A lead frame for use with a plastic encapsulated semiconductor device includes a tab on which the semiconductor chip is mounted, chip pad supporting leads to be connected to the tab, a plurality of inner leads to be electrically coupled with the semiconductor chip, outer leads formed in a monoblock structure together with the inner leads, a frame for supporting the chip pad supporting leads and the outer leads and being cut away after the semiconductor device is assembled, and a dam member made of an insulating material and disposed in a boundary between the inner leads and the outer leads for preventing a sealing resin from flowing out, the dam member being connected to the chip pad supporting leads or the frame at one position.

(3) A lead frame for use with a plastic encapsulated semiconductor device includes a tab on which the semiconductor chip is mounted, chip pad supporting leads to be connected to the tab, a plurality of inner leads to be electrically coupled with the semiconductor chip, outer leads formed in a monoblock structure together with the inner leads, a frame for supporting the chip pad supporting leads and the outer leads and being cut away after the semiconductor device is assembled, and a dam member made of an insulating material and disposed in a boundary between the inner leads and the outer leads for preventing a sealing resin from flowing out, the dam member being connected to the chip pad supporting leads or the frame at tow positions diagonal to each other.

(4) A lead frame for use with a plastic encapsulated semiconductor device includes a tab on which the semiconductor chip is mounted, chip pad supporting leads to be connected to the tab, a plurality of inner leads to be electrically coupled with the semiconductor chip, outer leads formed in a monoblock structure together with the inner leads, a frame for supporting the chip pad supporting leads and the outer leads and being cut away after the semiconductor device is assembled, and a dam member made of an insulating material and disposed in a boundary between the inner leads and the outer leads for preventing a sealing resin from flowing out, the dam member being connected to the chip pad supporting leads and the frame excepting at least at one position.

(5) A lead frame for use with a plastic encapsulated semiconductor device includes a tab on which the semiconductor chip is mounted, chip pad supporting leads to be connected to the tab, a plurality of inner leads to be electrically coupled with the semiconductor chip, outer leads formed in a monoblock structure together with the inner leads, a frame for supporting the chip pad supporting leads and the outer leads and being cut away after the semiconductor device is assembled, dummy leads disposed between electric signal leads for electric conduction to the semiconductor chip and the chip pad supporting leads or the frame, the dummy leads having no electric conduction to the semiconductor chip including at least only the outer leads, and a dam member made of an insulating material and disposed in a continuous manner between the electric signal leads and the dummy leads for preventing a sealing resin from flowing out.

(6) In a lead frame of item (5), the dummy leads are in an inner side relative to a clamp outer edge clamped by a metal molding.

(7) In a lead frame of item (1), an insulating tape is fixed onto the dam forming portion and is then clamped at a high temperature, thereby forming a dam bar.

(8) In a lead frame of item (1), a resin is applied onto the dam forming portion by a dispenser and is then clamped at a high temperature, thereby forming a dam bar.

(9) In a lead frame of any one of the items (1) to (8), the outer leads has a larger width in the dam member disposing portion.

(10) In a lead frame of any one of the items (1) to (9), the leads are arranged with a lead pitch less than 0.5 mm.

Furthermore, the semiconductor device of the present invention has either one configurations.

(11) A semiconductor device is fabricated by mounting a semiconductor chip on a lead frame according to one of the items (1) to (10), electrically connecting the semiconductor chip to the lead frame, and encapsulating the semiconductor chip and the lead frame with a resin.

(12) A semiconductor device uses a lead frame for use with a plastic encapsulated semiconductor device including a tab on which the semiconductor chip is mounted, chip pad supporting leads to be connected to the tab, a plurality of inner leads to be electrically coupled with the semiconductor chip, outer leads formed in a monoblock structure together with the inner leads, a frame for supporting the chip pad supporting leads and the outer leads and being cut away after the semiconductor device is assembled, and a dam member made of an insulating material for preventing a sealing resin from flowing out, wherein the dam member is in the periphery of the outer leads but is not at least at one position in the periphery of the chip pad supporting leads undergone the cutting process.

(13) In a semiconductor device of item (12), flatness of an outer edge of the inner leads undergone the wire bonding process is at most 100 μm.

(14) In a semiconductor device using the lead frame of item (8), the dam member is removed after the semiconductor device is assembled.

(15) A semiconductor device uses a lead frame for use with a plastic encapsulated semiconductor device comprising a tab on which the semiconductor chip is mounted, chip pad supporting leads to be connected to the tab, a plurality of inner leads to be electrically coupled with the semiconductor chip, outer leads formed in a monoblock structure together with the inner leads, a frame for supporting the chip pad supporting leads and the outer leads and being cut away after the semiconductor device is assembled, and a dam member made of an insulating material for preventing a sealing resin from flowing out, wherein flatness of an outer edge of the inner leads undergone the wire bonding process is at most 100 μm.

According to the above means, the insulating dam member disposed between the outer leads serves the function of the conventional dam bar fabricated in the monoblock structure together with the lead. Moreover, in the lead frame, since the dam of resin is not extended to the outer frame thereof, the deformation in the outer region is prevented and hence there can be remarkably minimized the camber of the lead frame due to the dam member, thereby solving the problems related to occurrence of the camber.

Furthermore, there is provided a lead frame and a semiconductor device using the same in which the outer lead molding process can be appropriately carried out with the same molding jigs as those used in the prior art.

That is, another object of the present invention is achieved by employing an outer lead bending process in which a portion of the lead thus bent has a narrow width and a minimized thickness.

According to the present invention, there is provided a lead frame for use with a plastic encapsulated semiconductor device generally including a rectangular and planar tab for mounting thereon a semiconductor chip, an outer frame for supporting the tab by chip pad supporting leads from four directions, groups of inner leads being laterally arranged respectively corresponding to four edges of the tab and extending outward from positions near the edges, groups of outer leads being linked with the inner leads and extending outward to be coupled with the outer frame, and a dam member made of resin connecting the laterally arranged outer leads to each other. When molding the dam member, only the outer leads are coupled with each other by the dam member, namely, the outer frame or chip pad supporting leads having high rigidity is or are not connected thereto. Consequently, when the resin is hardened, deformation of the dame member is absorbed by the outer leads having low rigidity to suppress deformation of the entire lead frame. Furthermore, when bending the outer leads, the width and thickness of the bent portion thereof is minimized for facilitating the forming process. Next, description will be given in detail of the present invention.

To achieve the object, a first lead frame of the present invention is a lead frame for a plastic encapsulated semiconductor device including a rectangular and planar tab for mounting on a surface thereof a semiconductor chip, chip pad supporting leads being connected respectively four corners of the tab and extending outward, an outer frame coupled with outer ends of the respective chip pad supporting leads for supporting the tab from four directions, groups of inner leads being laterally arranged respectively corresponding to four edges of the table and extending outward from positions near the edges, groups of outer leads linked with outer ends of the inner leads and extending outward to be coupled with the outer frame, and an insulating dam member connecting only the outer leads to each other for each group thereof in the proximity of a boundary between the inner leads and the outer leads, thereby filling gaps between the adjacent outer leads with the dam member. Moreover, in a portion of each of the outer leads in an area in which the dam member is arranged, there is disposed a narrow portion having a reduced lead width.

Moreover, like the first lead frame, a second lead frame of the present invention is a lead frame for a plastic encapsulated semiconductor device including the components such as a tab, chip pad supporting leads, an outer frame, inner leads, and outer leads. There is disposed an insulating dam member connecting only the outer leads to each other for each group thereof in the proximity of a boundary between the inner leads and the outer leads, thereby filling gaps between the adjacent outer leads with the dam member. Moreover, there is arranged an additional dam member extending from the dam member connecting two adjacent groups of outer leads to a chip pad supporting lead existing therebetween. Furthermore, in a portion of each of the outer leads in an area in which the dam member is arranged, there is disposed a narrow portion having a reduced lead width. The additional dam member is arranged at one to three positions.

Additionally, like the first lead frame, a third lead frame of the present invention includes the components such as a tab, chip pad supporting leads, an outer frame, inner leads, and outer leads. There is further disposed dummy leads on both adjacent sides of each of the chip pad supporting leads and extending inward from the outer frame. There is disposed an insulating dam member connecting in the vicinity of a boundary between the inner leads and the outer leads two dummy leads and one of the groups of outer leads enclosed by the dummy leads, gaps between the adjacent dummy leads and between the outer leads being filled with the insulating dam member. Furthermore, in a portion of each of the outer leads in an area in which the dam member is arranged, there is disposed a narrow portion having a reduced lead width.

In addition, there are disposed variations respectively of the first to third lead frames of the present invention. In a portion of each outer lead in the area in which the dam member is disposed, it is favorable to dispose before and after the narrow portion a wide portion having a larger lead width as the portion in the vicinity. Alternatively, in place of the narrow portion, there may be disposed a thin portion having the same lead width and a smaller lead plate thickness as the portion existing in the vicinity. In this situation, the thin portion is favorably disposed by forming a depression on an upper surface of the outer lead.

In this connection, in the first to third lead frames and variations thereof, the outer frame is a member to be cut away after the semiconductor chip is connected to the inner leads by wires and the semiconductor chip and the inner leads are molded with resin, whereas the narrow portion having a smaller lead width is at a position where the bending process is effected after the outer frame is cut away.

To achieve the object above, there is provided a semiconductor device according to the present invention in which the semiconductor device is mounted on either one of the lead frames according to the present invention and in which the inner leads connected to the semiconductor device by wires are encapsulated with a sealing resin. Moreover, the outer frame is cut away and the outer leads are bent at the narrow portion (or the thin portion).

According to the lead frame for use with a plastic encapsulated semiconductor device, a semiconductor device is mounted on the tab to be connected to the inner leads by wires and then the portions of the tab, semiconductor device, and inner leads are covered by a metal mold. The cavity of the mold is filled with liquid resin so as to encapsulate the portions. To prevent resin from flowing out from the cavity through gaps between the adjacent inner leads in this process, there is disposed a dam member in the boundary between the inner and outer leads on the outer lead side. The leads to be conducted to the semiconductor device via wires include the inner leads are disposed in the sealing resin and the outer leads are arranged outside the resin.

In each of the lead frames according to the present invention, the insulating dam member disposed for the outer leads serves a function similar to that of the dam bar conventionally formed together with the lead frame with the same material in a monoblock structure. Furthermore, since the dam member does not extend to the outer frame having higher rigidity, deformation of the applied dam member during hardening thereof is absorbed in the leads having low rigidity to resultantly suppress the deformation of the overall lead frame. Since the camber of the lead frame due to the dam member can be remarkably minimized, it is possible to solve the problems, for example, peeling and disconnection of wire connecting portions.

According to the lead frame, after the encapsulating process, the outer frame is cut away and the outer leads are bent in the proximity of the encapsulation resin mold. In the lead frame of the present invention, in the area in which the outer leads are disposed, the portion of the outer lead bending position is formed as a narrow portion having a small lead width or as a thin portion to reduce rigidity of the lead. Consequently, the outer leads for which the dam member is arranged can be easily bent at the same position as for the conventional lead frame and hence the outer leads can be molded into a contour equal to that of the conventional outer leads.

That is, according to the lead frame of the present invention, in the area in which the dam member is disposed, the portion of the outer lead bending position is formed as a narrow portion having a reduced lead width or as a thin portion to minimize rigidity of the lead. In consequence, the outer leads can be easily bent at the same position associated with that of the conventional lead frame and hence the outer leads can be molded into the same shape as those of the conventional products.

According to the present invention, it is possible to considerably reduce occurrence of camber appearing in the entire lead frame when the dam bar is formed with a dam member including an insulating tape or resin. Moreover, since three-dimensional camber is prevented by forming the dam only between the outer leads, there appears only two-dimensional deformation in the outer ends of inner leads. In consequence, the amount of deformation of the outer ends of inner leads can be easily estimated according to the contour of the leads and a characteristic of the dam member, thereby efficiently preventing unsatisfactory wire bonding. Furthermore, when fabricating the dam bar with an insulation tape, it is necessary to form the tape in the contour of a frame according to the inventions of the prior art as shown in FIG. 3. However, the process is unnecessary according to the present invention and hence the production cost is lowered. According to the present invention, the outer leads are bent at a predetermined position. In accordance with the present invention, there can be obtained a fine pitch configuration having a fine pitch of 0.2 mm to 0.5 mm.

BRIEF DESCRIPTION OF THE DRAWINGS

These and other objects and advantages of the present invention will become apparent by reference to the following description and accompanying drawings wherein:

FIG. 1A is a plan view of a lead frame as a first embodiment of the present invention;

FIGS. 1B and 1C are diagrams showing portions of cross sections of the lead frame of FIG. 1A;

FIG. 5 is a plan view of a lead frame as a third embodiment of the present invention;

FIG. 11 is a top-surface view of a semiconductor device as a tenth embodiment according to the present invention;

FIG. 12 is a cross-sectional view for explaining a position where a dam member is formed with resin according to the present invention;

FIG. 14 is a magnified perspective view of the bending portion of the base portion of the outer lead;

DESCRIPTION OF THE PREFERRED EMBODIMENTS

Figure 2:
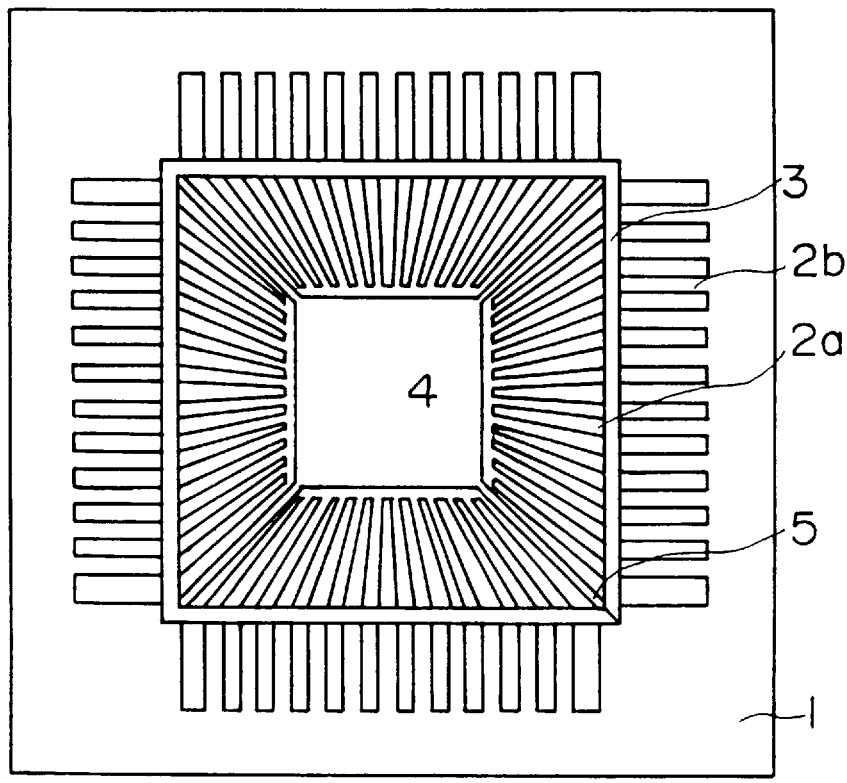
FIG. 2 is a plan view of a lead frame using a conventional dam member.
Figure 3:
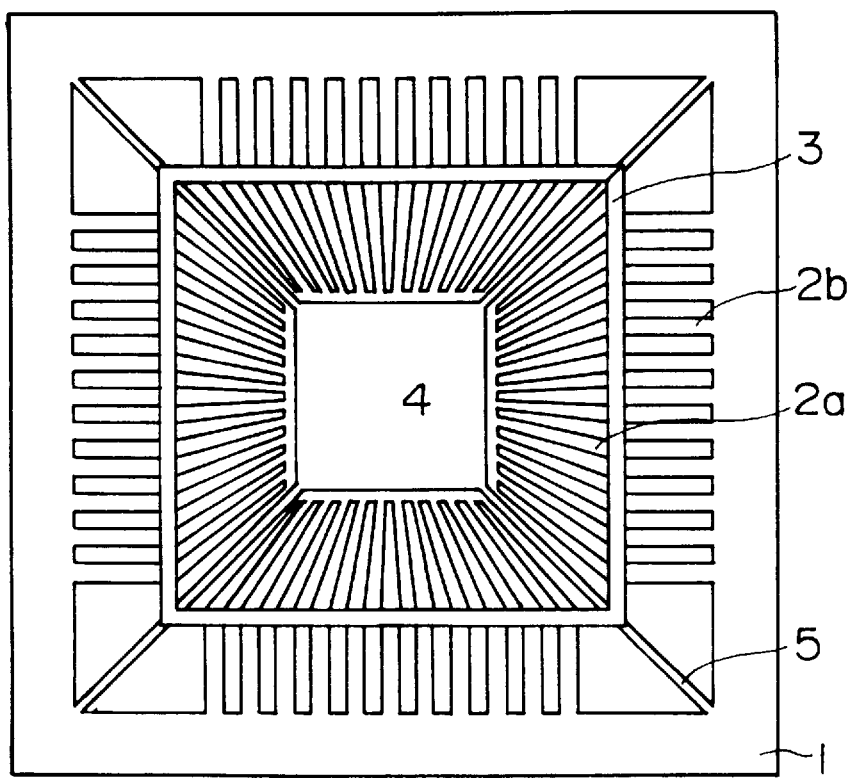
FIG. 3 is a plan view of a lead frame using a conventional dam member.

FIG. 1A shows in a plan view a first embodiment of the lead frame according to the present invention.

The lead frame includes a tab 4 as a portion for mounting thereon a semiconductor chip, chip pad supporting leads 5, inner leads 2a, and outer leads 2b continuously connected to the inner leads, a dam member 3 is formed in a boundary between the inner leads 2a and the outer leads 2b in which the dam bar has been disposed in the monoblock structure, thereby connecting the outer leads 2b to each other by the dam member 3.

The dam member 3 is not formed in a continuous fashion with respect to an outer frame 1 of the lead frame or the supporting leads 5. Namely, the dam member 3 is disposed only to connect the outer leads 2b to each other and is separated from the outer frame 1 of the lead frame or the supporting leads 5. However, it is not necessary to separate all connected portions, namely, the separating portions need only be decided according to products.

Resin flows into a portion (burr) of FIG. 1A in the molding step. However, the resin can be easily removed therefrom when the supporting leads 5 are cut off or when the leads are bent. Since contraction in the hardening phase of the dam member 3 formed only between the outer leads 2b is absorbed by the internal deformation between the outer leads 2b, the camber of the lead frame can be remarkably minimized when compared with the conventional structure.

The dam member used in the present invention can be selected from the group including an insulating epoxy resin, BT resin, phenole resin, polyimid resin, isomeran resin, silicone resin, any thermosetting resin produced with a plurality of above resins or any thermoplastic resin such as aromatic polyetheramid, plyetheretherketone, polysulfone, aromatic plyesterimid, polyester, and (circulation) polyimid. When using an insulating tape, it is possible to fix an insulation film with the above material so as to clamp the insulation film at a high temperature.

When forming the dam member 3, a lead frame material is formed into a predetermined pattern by pressing or etching such that the resin is applied by a dispenser only to spaces between the outer leads 2b in the portion in which the dam bar is conventionally arranged. The resin is then heated and formed under pressure by a clamp. As can be seed from the cross section taken along line AA' of FIG. 1A, the dam portion is configured to enclose the outer leads 2b. FIGS. 1B and 1C show cases in which the resin is applied onto only one surface and both surfaces, respectively. The resin is applied to the surface, for example, by potting or stamping. In this operation, when a resin having high viscosity is applied onto a rear surface of the lead frame, it is possible to prevent the resin from flowing onto the front surface thereof and hence there is attained an appropriately finished product. In FIG. 1A of the present invention, the dam member 3 is discontinuous at four positions. However, the advantageous effect of the present invention can be attained only with one discontinuous portion of the dam member 3.

In this regard, the dam member is disposed at a position as shown in FIG. 12. Namely, the lead frame member 26 is interposed between an upper piece 22 of the metal mold and a lower piece 23 thereof such that resin 25 is injected into a cavity 24 configured in the metal mold. Centered on a portion at which the upper piece 22 is brought into contact with the lower piece 23, there is established a resin dam zone 21 having a relatively large width.

Figure 4:
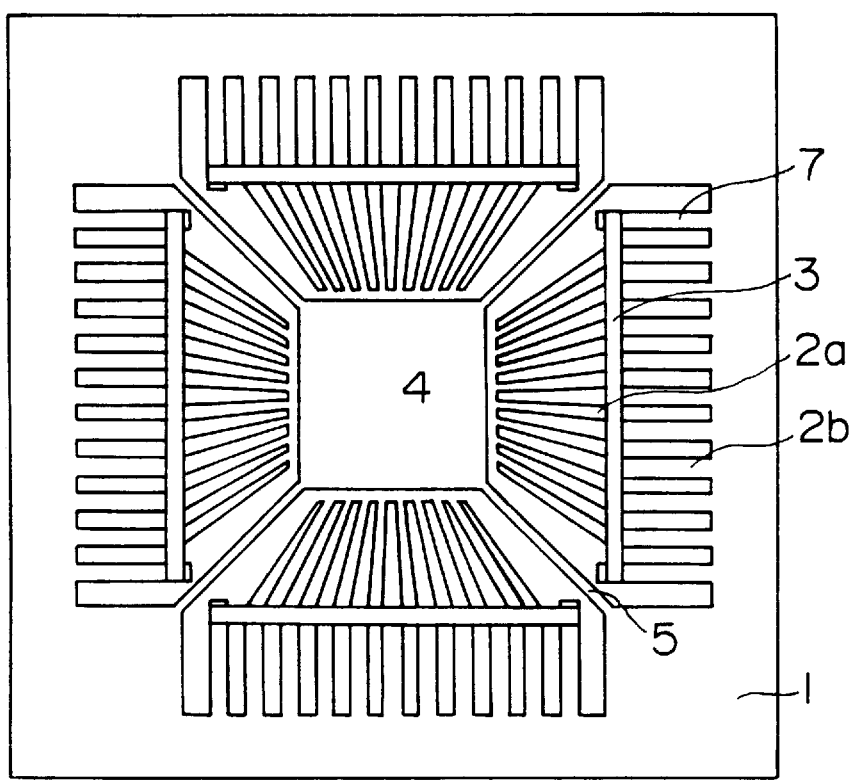
FIG. 4 is a plan view of a lead frame as a second embodiment of the present invention.

FIG. 4 is a plan view showing a second embodiment of the lead frame according to the present invention.

Between leads (inner leads 2a and outer leads 2b) for electric conduction and an outer frame 1 of the lead frame, there are missing inner leads, namely, electric conduction is not provided. There are fabricated dummy outer leads 7 (to be referred to as dummy leads herebelow), which are cut away after the resin molding process, such that boundary portions between the dummy outer leads 7 and adjacent inner leads 2a and outer leads 2b are filled with the dam member 3 to couple the components with each other via the dam member 3 in the method described above.

The dummy outer leads 7 may be fabricated respectively in association with the outer frame 1 of the lead frame or either one of the ends thereof. The dummy outer leads 7 absorb contraction of the dam member 3 in the contracting phase thereof to minimize the camber of the lead frame.

Additionally, in the first embodiment, it is required that the electric signal leads in the corners are clamped by the metal mold when the resin molding process is carried out without disposing the dummy leads 7. In contrast therewith, according to the second embodiment, since the dummy leads 7 in the corners can be used as clamping surfaces, it is possible to prevent defects and deformation due to the clamping of the electric signal leads.

To prevent the resin from leaking out of the metal mold in the molding process, in a portion 6 of FIG. 1A and in FIG. 4, the gaps between the outer frame 1 of the lead frame and the dummy leads 7 are required to be at an inner position relative to the outer end of portions clamped by the metal mold.

FIG. 5 is a plan view showing a third embodiment of the lead frame according to the present invention. In an outer frame of the lead frame, there are formed slits 8 having an opening at an outer end thereof as shown in the diagram so as to form dummy leads 7a in an L shape in which the leads are bent by a right angle at an intermediate point thereof. The slit 8 is not limited to this shape if the dummy lead 7a can be formed in the bending structure. Boundary portions between the dummy leds 7a, inner leads 2a, and outer leads 2b are filled with the dam member 3 to link the components with each other in the molding method described above.

Like the first and second embodiments, this embodiment requires that the slits 8 are at an inner position relative to an outer end of clamp 12 to be clamped by the clamp. However, since the dummy lead 7a is configured in an L shape, the clamping area of the outer frame 1 of the lead frame can be considerably minimized when compared with the first and second embodiments. Consequently, this efficiently prevents deformation and camber of the lead frame due to the clamping.

Figure 6:
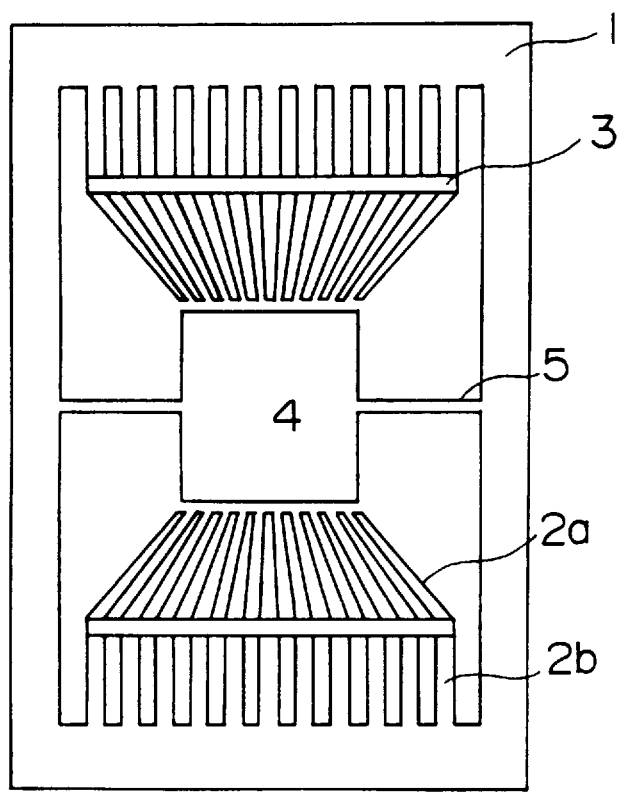
FIG. 6 is a plan view of a lead frame as a fourth embodiment of the present invention.

FIG. 6 is a plan view showing a fourth embodiment of the lead frame according to the present invention. The leads of the first to third embodiments are arranged in two directions. Also in this case, the dam member 3 is disposed only between the outer leads 2b and is not brought into contact with the outer frame 1 of the lead frame.

Figure 7A:
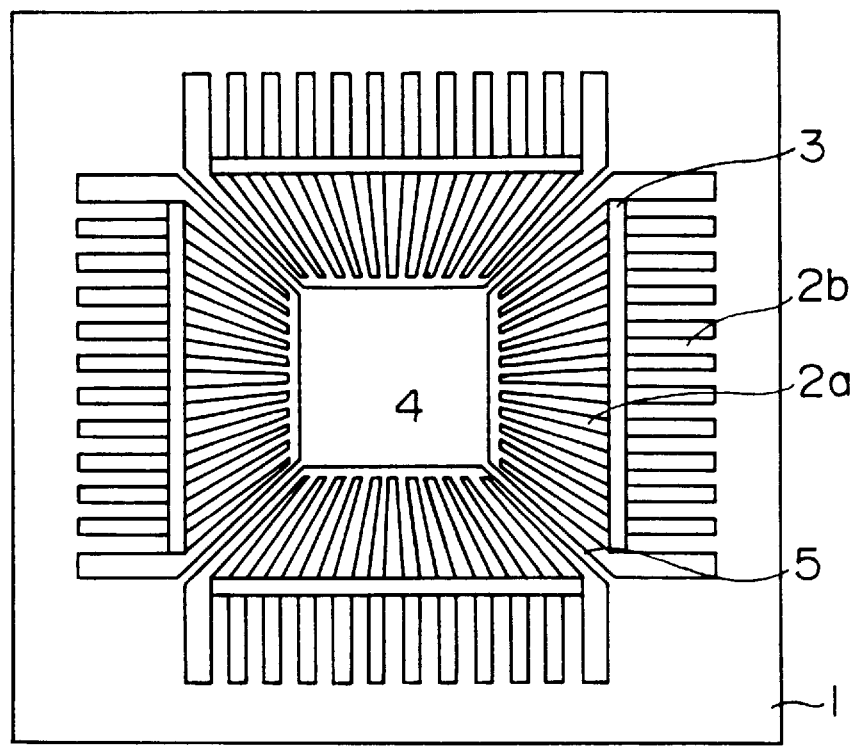
FIG. 7A is a plan view of a lead frame as a fifth embodiment of the present invention.
Figure 7B:
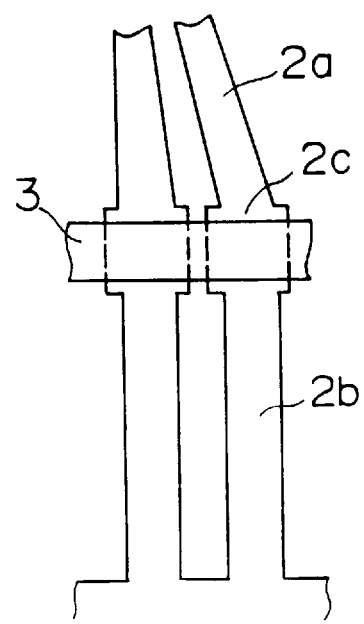
FIG. 7B is magnified view for explaining a portion of a cross section of the lead frame of FIG. 7A.

FIG. 7 is a plan view showing a fifth embodiment of the lead frame according to the present invention. The width of outer leads 2b is enlarged only in the portion in which the dam member 3 is disposed so as to form wide lead portions 2c, thereby facilitating the application process of the dam member 3.

FIG. 14 is a magnified view of the plan view of the lead frame as a sixth embodiment according to the present invention.

Figure 17:
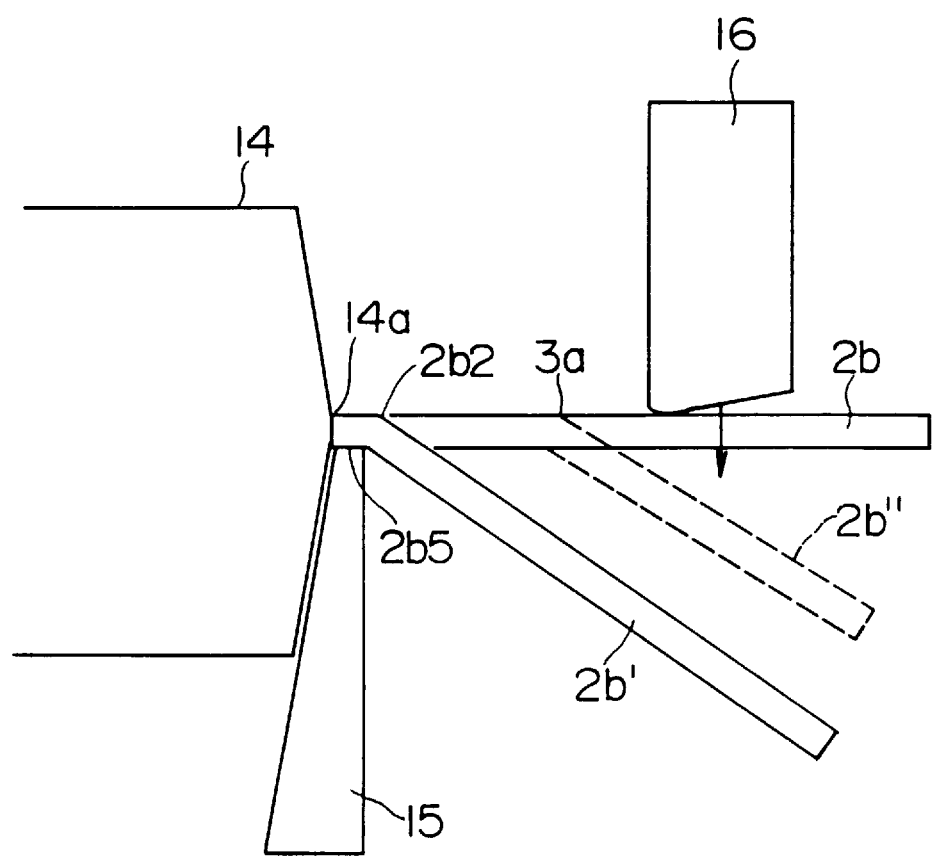
FIG. 17 is a plan view showing an example of the molding of an outer lead.

To enable a semiconductor device using a lead frame to be mounted on an actual printed circuit board after the molding process with sealing resin, there is employed a molding process of bending the outer leads according to a predetermined contour. FIG. 17 shows an example of the molding process of the outer leads. Keeping by a retaining jig 15 a lower surface 2b5 of a base portion (in the neighborhood of a package side surface 14a) of an outer lead 2b, an upper surface of the outer lead 2b is pushed by a bending jig 16 so as to bend the outer lead 2b downward at a bending position 2b2 in the vicinity of the side surface 1a. As a result, the outer lead is bent as indicated by a reference numeral 2b' in FIG. 17.

The bending position 2b2 of the outer lead 2b is apart from the package side surface 14a by 0.1 mm to 0.3 mm and is in a portion in which the dam member is disposed. When the bending position 2b2 of the outer lead 2b is in the portion in which the dam member is disposed, the base portion of the outer lead has higher rigidity due to presence of the dam member. Consequently, the outer lead is bent as indicated by 2b" at a position 3a in the outer end portion of the dam member, which leads to a problem that the outer lead cannot be bent at the originally desired bending position 2b2. Namely, when the outer leads of the lead frame in which the conventional dam bar is formed in the monoblock structure are molded by the lead molding jigs, there arise problems that the outer leads after the molding process is different in contour from those of the conventional lead frames and hence flatness of the outer leads cannot be retained and the molding jigs are brought into contact with the lead and plated coating is peeled from the leads and the molding jigs are worn.

Figure 13:
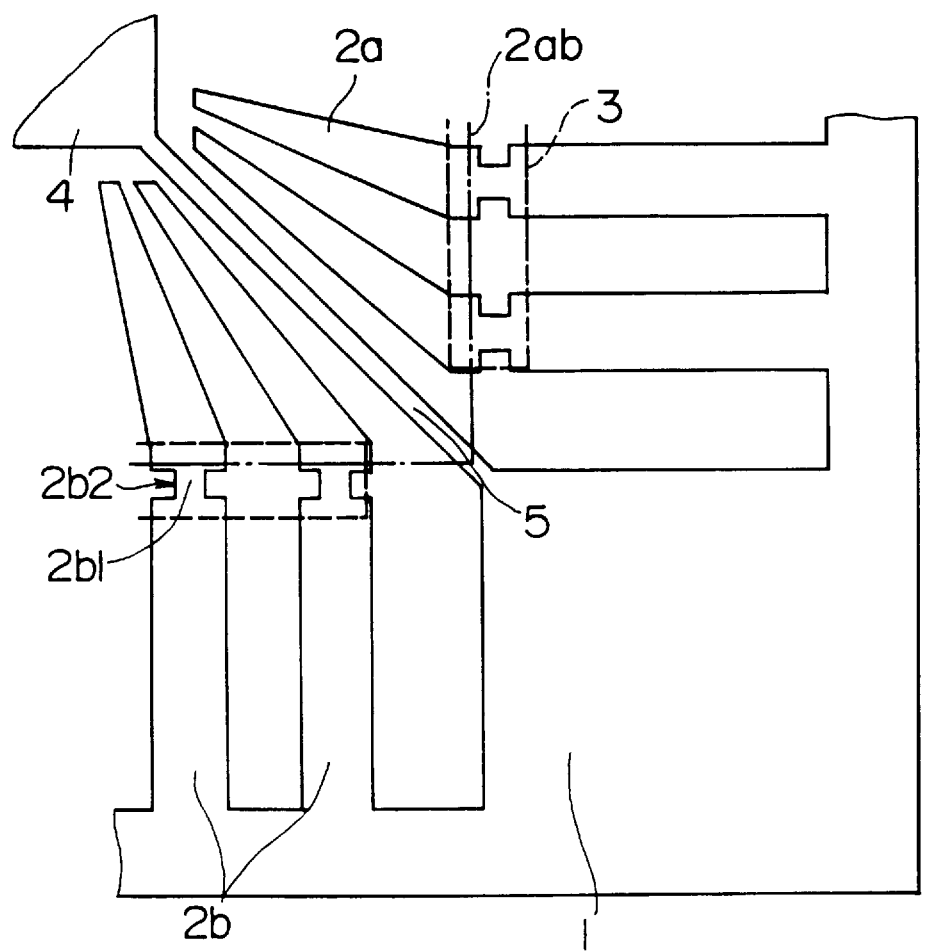
FIG. 13 is a partially magnified view of the plan view of the lead frame of the sixth embodiment according to the present invention.

In a portion of the outer lead 2b in the area in which the dam member 3 is disposed, there is formed a lead portion 2b1 having a narrow width as shown in the magnified view of FIG. 13. In this regard, the area in which the dam member 3 is arranged is indicated by broken lines. The reduced-width portion 2b1 is employed to mount a semiconductor chip on the lead frame and is substantially at a bending position 2b2 where the outer leads 2b processed with a sealing resin are bent in the molding process. Namely, the position corresponds to the position 2b2 of FIG. 17, indicating that the outer leads 2b are bent at the predetermined position.

Furthermore, thanks to the provision of the lead portion 2b1 having a narrow width in the portion of the outer lead 2b in the area where the dam member 3 is disposed, the outer lead has lower rigidity in the bent portion. Consequently, in the process of bending the outer lead 2b, it is possible to bend the outer lead 2b at a position equal to that of the conventional lead frame in which four dam bars are entirely coupled with each other in a monoblock structure. Namely, the shape of the lead after the bending process is same as that of the conventional products. In consequence, the molding jigs adopted in the prior art can also be utilized; moreover, the problems occurring in the molding process can be prevented.

In addition, FIG. 14 shows a magnified perspective view of another example of the bending portion in the base portion of the outer lead. In the bending position, the plate thickness is decreased to reduce rigidity. In an area of the outer lead 2b including the bending position 2b2 in the portion where the dam member 3 is arranged, there is fabricated a thin portion 2b3 having a reduced lead thickness. Thanks to provision of the thin portion 2b3 as shown in FIG. 14, rigidity is lowered in the bending position 2b2 of the outer lead 2b. In consequence, when forming the outer lead 2b, the outer lead 2b can be bent at the same position as that of the conventional lead frame in which dam bars are molded in a monoblock structure. The thin portion 2b3 is molded by disposing a depression on one of or both of the surfaces of the outer lead 2b. The depression is disposed favorably in a surface upon which tensile stress acts when the outer lead 2b is bent, thereby reducing the thickness.

Figure 15:
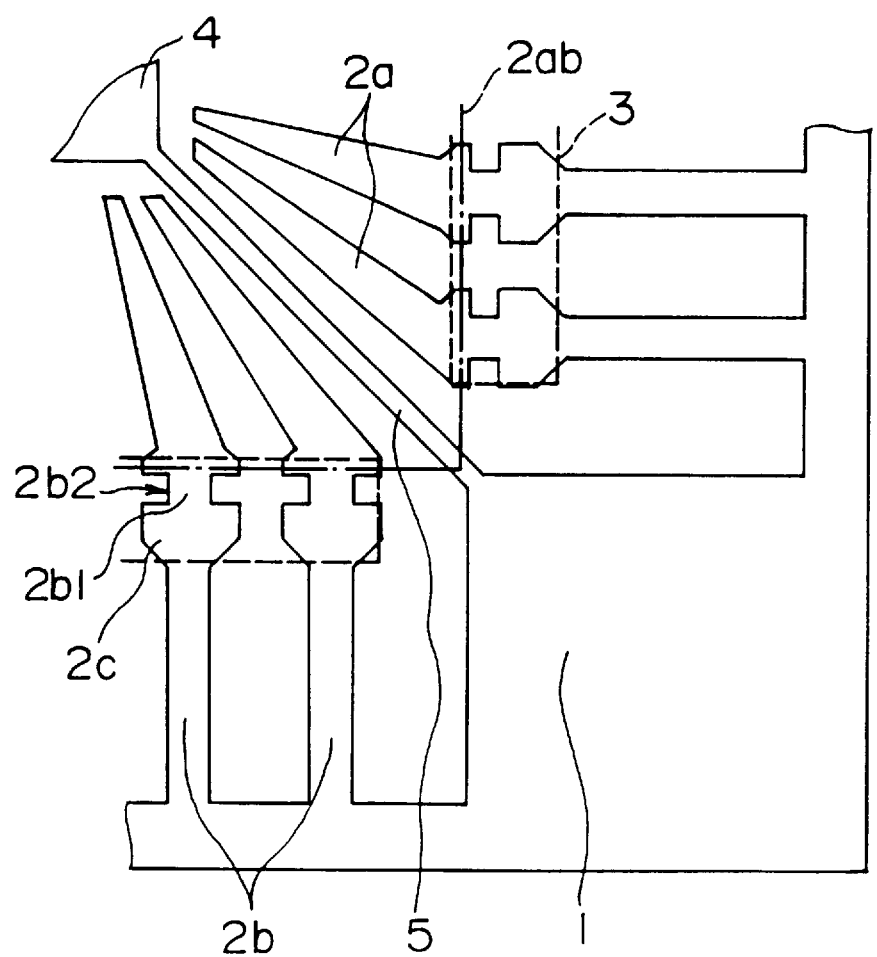
FIG. 15 is a partially magnified view of the plan view of the lead frame of the seventh embodiment according to the present invention.

FIG. 15 is a diagram showing a seventh embodiment of the lead frame according to the present invention in which a portion of the lead where the dam member is disposed is magnified.

The dam member 3 is arranged in a portion including a boundary 2ab between the outer lead 2b and the inner lead 2a. In FIG. 15, a zone where the dam member 3 is disposed is indicated by broken lines. In a lead portion in which the dam member 3 is disposed, there is formed a wide portion 2c having a larger lead width excepting a portion 2b of the outer lead 2b. The reduced-width portion 2b in the wide portion 2c matches the lead bending position 2b2 in the bending process of the outer lead 2b after the resin molding process.

Thanks to provision that the wide portion 2c having a larger lead width is manufactured in the portion where the dam member 3 is disposed excepting the portion matching the bending position of the outer lead 2b, the process of applying the dam member 3 can be facilitated.

Figure 8:
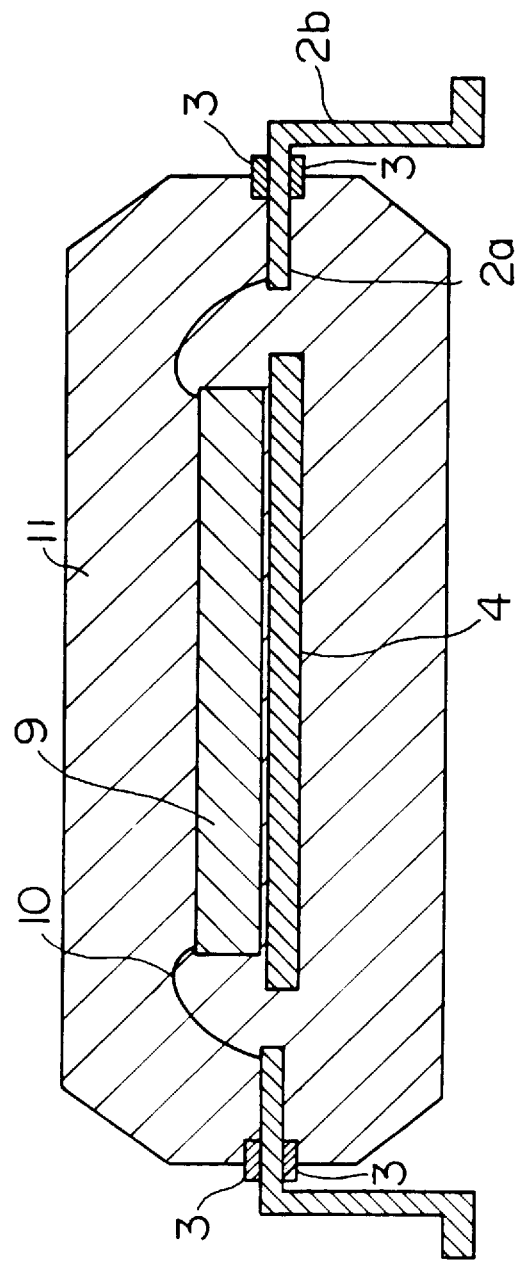
FIG. 8 is a cross-sectional view of a semiconductor device as an eighth embodiment according to the present invention.
Figure 16:
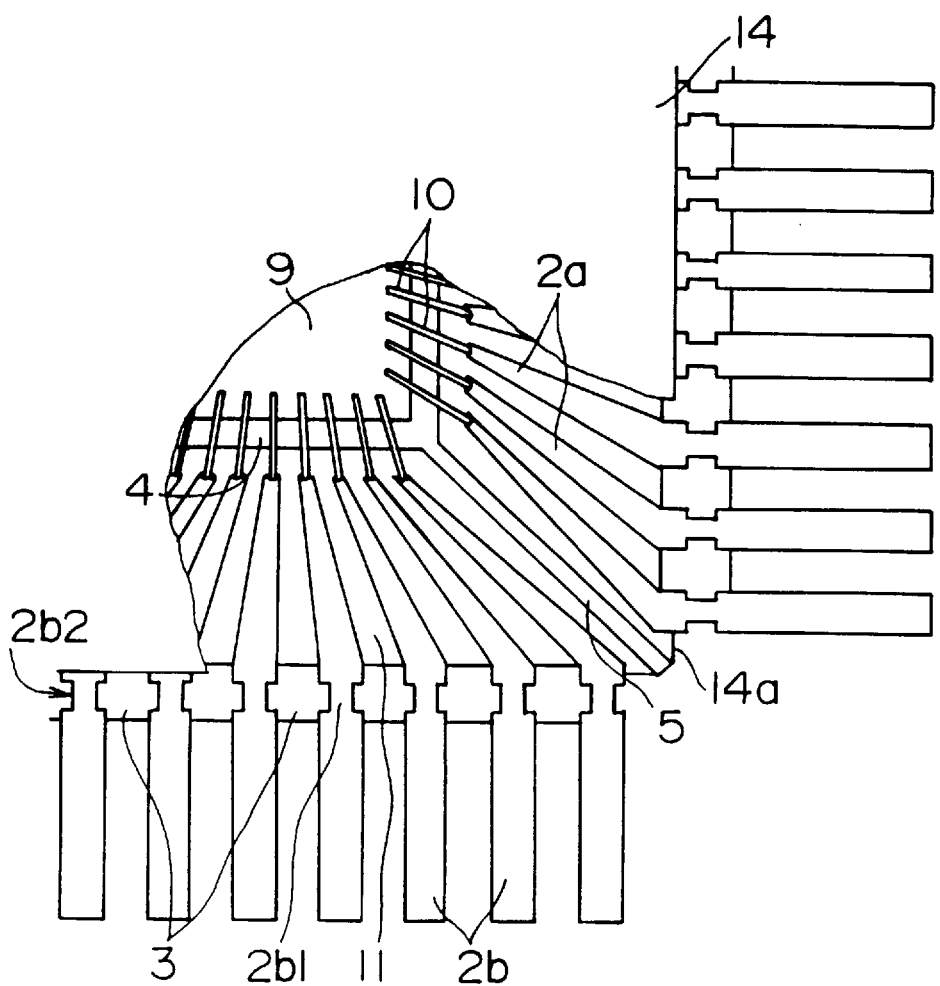
FIG. 16 is a plan view partially showing a semiconductor device as an eighth embodiment of the present invention.

FIGS. 16 and 8 show the eighth embodiment according to the present invention. FIG. 16 shows a state thereof prior to the lead bending process of the lead frame in which the sealing resin is partially removed. FIG. 8 is a cross-sectional view showing the contour of outer leads after the molding process.

Processes of fabricating a semiconductor device shown in FIGS. 16 and 8 are as follows. On a tab 4 of the lead frame shown in FIGS. 1 and 4 to 7, a semiconductor chip 9 is mounted with a die bonding agent and then predetermined areas respectively of the chip 9 and inner leads 2a are electrically connected to each other by fine metallic wires 10. In addition, the lead frame is arranged in a metal mold and then a sealing resin 11 is supplied to the metal mold, thereby achieving a resin molding process.

Thereafter, chip pad supporting leads 5 and burrs of resin remaining in the periphery thereof are simultaneously cut away and then the outer leads 2b are cut and formed according to determined lengths, thereby obtaining a semiconductor device. According to the semiconductor device thus fabricated using the lead frame of the present invention, since the camber of the lead frame is remarkably minimized, flatness of the outer end portion of inner leads undergone the wire bonding process can be set to 100 μm or less required for reliability of wires.

Figure 9:
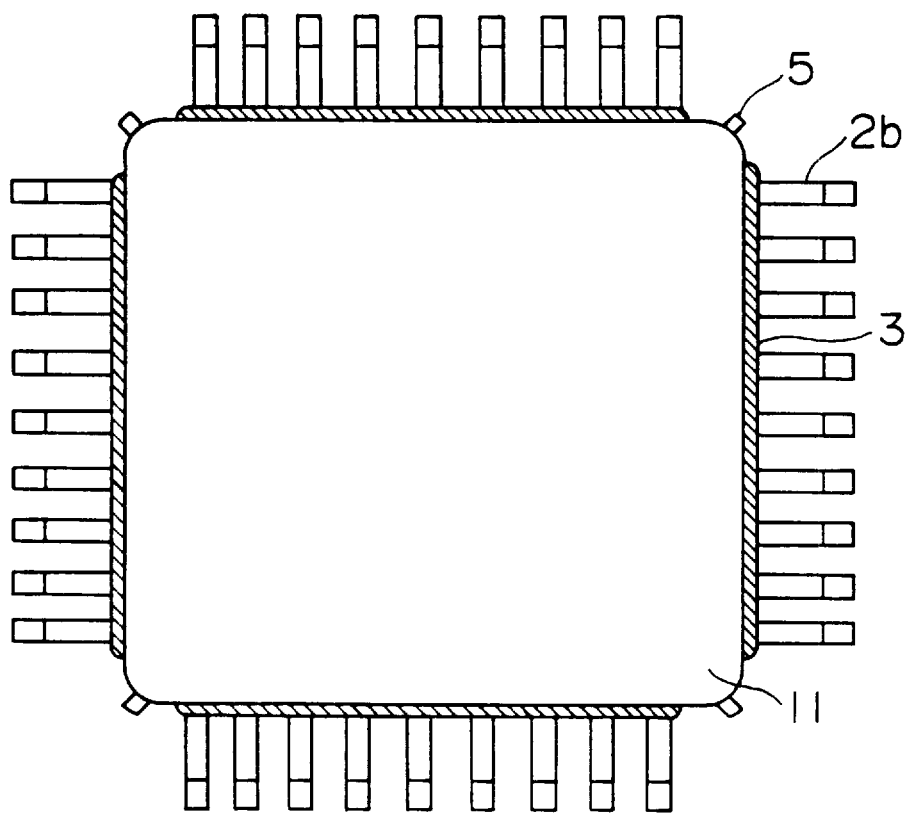
FIG. 9 is a top-surface view of a semiconductor device as a ninth embodiment according to the present invention.

FIG. 9 shows an upper-surface view of the semiconductor device thus produced. In the periphery of the outer leads 2b in the outer-edge portion of the sealing resin 11, there remains the dam member 3. Since the dam member 3 is formed to be separated from the chip pad supporting leads 5, the dam member 3 is missing in the periphery of the supporting leads 5 after the cutting process. However, as described in conjunction with the first embodiment, it is not necessary that the dam bar is formed to be separated from all chip pad supporting leads. Consequently, according to the present invention, it is also possible that the dam member 3 is missing in the periphery of at least one of the chip pad supporting leads in the obtained semiconductor device.

Figure 10:
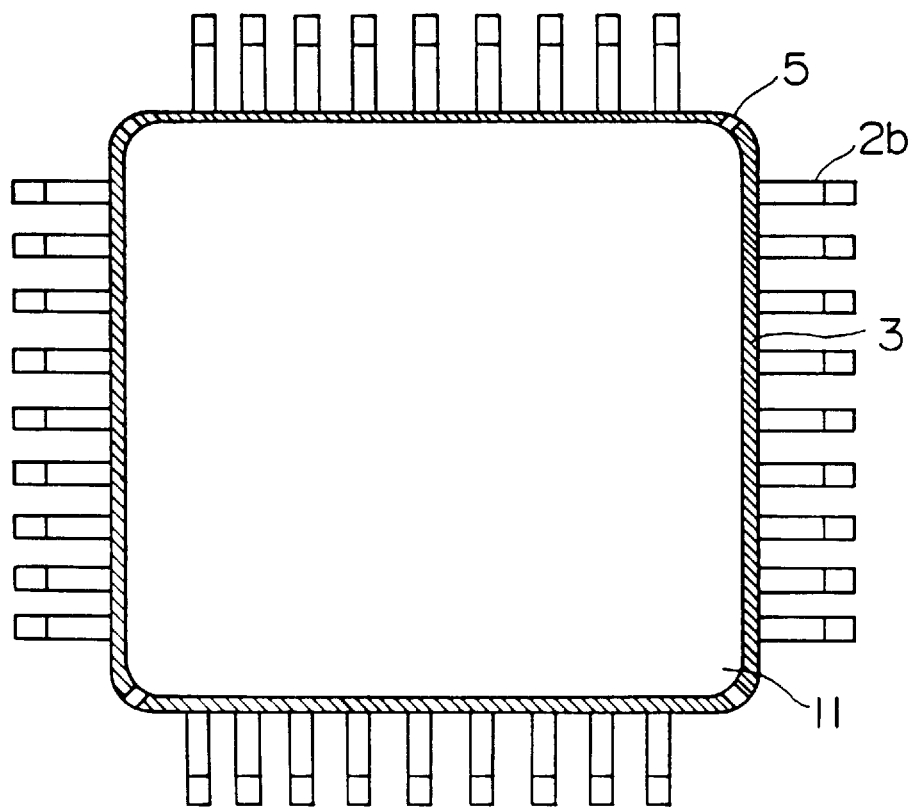
FIG. 10 is a top-surface view of a semiconductor device as a conventional example.

When a semiconductor device is fabricated with a lead frame according to the conventional inventions, the resin dam and the like are formed in the area where the conventional dam bar is disposed in the monoblock structure. Consequently, a continuous portion of the remaining dam member 3 appears also between the chip pad supporting lead 5 undergone the cutting process and the outer lead 2b adjacent thereto as shown in FIG. 10.

Furthermore, the dam portion is made of an insulating organic substance. In consequence, although there arises no problem in the state, the dam portion can be easily removed by an organic solvent or the like.

FIG. 11 shows an upper-surface view of the semiconductor device in which the dam portion is removed. Since a portion of the dam member 3 is also formed in the resin molding process as shown in FIG. 8, when the dam portion is removed by an organic solvent or the like, there appears a gap 13 in the portion from which the dam portion is removed. In a case of a semiconductor device using a lead frame according to the present invention, the gap 13 appears only in the periphery of the outer leads 2b. In a case of a semiconductor device using a lead frame according to the prior inventions, the dam member 3 of FIG. 10 is entirely removed. Consequently, it can be appreciated that the depression appears in a continuous fashion between the chip pad supporting lead 5 undergone the cutting process and the outer lead 2b adjacent thereto.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A method of manufacturing a lead frame including a tab for mounting thereon a semiconductor chip, the tab having four edges in a substantially rectangular contour, at least two chip pad supporting leads connected to the tab for supporting the tab, of leads including inner leads and outer leads and having end surfaces being apart from at least two edges of the four edges of the tab and opposing to each other, the chip pad supporting leads having an end connected only to an outer frame of the lead frame, and a dam member made of an insulating material and disposed only between the outer leads for preventing a sealing resin from flowing out, comprising the steps of mounting the semiconductor chip on the tab; and forming the dam member in a linear shape, the dam member traversing the groups of leads and being apart from the chip pad supporting leads.

2. A lead frame manufacturing method according to claim 1, wherein the dam member fabricated by attaching a tape-shaped substance on at least one of two side surfaces of the groups of leads.

3. A lead frame manufacturing method according to claim 1, wherein the dam member is fabricated by dropping or applying a liquid resin compound on an upper surface and spaces between the groups of leads, the dam member traversing the groups of leads and being heated for hardening thereof.

4. A method of manufacturing a lead frame including a tab for mounting thereon a semiconductor chip, the tab having four edges in a substantially rectangular contour, chip pad supporting leads connected to four corners of the tab and the outer frame, groups of leads including inner leads and outer leads, and having end surfaces being apart from side surfaces of the four edges of the tab and opposing to each other, the chip pad supporting leads having an end connected only to an outer frame of the lead frame, and a dam member made of an insulating material and disposed only between the outer leads for preventing a sealing resin from flowing out, the method comprising the step of mounting the semiconductor chip on the tab, and forming the dam member in a linear shape in association with each of the four edges, the dam member traversing the associated group of leads and being apart from the chip pad supporting leads.

5. A lead frame manufacturing method according to claim 4, wherein the dam member is fabricated by attaching a tape-shaped substance on at least one of two side surfaces of the groups of leads.

6. A lead frame manufacturing method according to claim 4, wherein the dam member is fabricated by dropping or applying a liquid compound on an upper surface and spaces between the groups of leads, the dam member traversing the groups of leads and being heated for hardening thereof.

7. A method of fabricating a semiconductor device using a lead frame according to claim 1, wherein when the lead frame is clamped by a metallic mold, outer edges of the clamp are on a surface of dummy leads and along the dummy leads.

8. A method of fabricating a lead frame according to claim 1, wherein an insulating tape is attached onto a dam forming region and is clamped at a high temperature, thereby forming the dam member.

9. A method of fabricating a lead frame according to claim 1, wherein a resin is applied onto a dam forming region by a dispenser and is clamped at a high temperature, thereby forming the dam member.

10. A method of fabricating a lead frame according to claim 4, wherein an insulating tape is attached onto a dam forming region and is clamped at a high temperature, thereby forming the dam member.

11. A method of fabricating a lead frame according to claim 4, wherein a resin is applied onto a dam forming region by a dispenser and is clamped at a high temperature, thereby forming the dam member.

12. A method of manufacturing a semiconductor device in which a semiconductor chip is mounted on a tab having four edges, at least two chip pad supporting leads extend from the tab to support the tab, groups of leads are disposed including inner leads and outer leads, the leads having end surfaces being apart from at least two edges of the four edges of the tab and opposing to each other, a dam member made of an insulating material and disposed only between the outer leads for preventing a sealing resin from flowing out, conducting means connecting each of the groups of leads to the semiconductor chips, wherein portions of each of the groups of leads on a tab side, the tab, the chip pad supporting leads, and the conducting means are sealed with a resin, the method comprising the following steps of:

conducting a resin molding process in which a lead frame in which the chip pad supporting leads and the groups of leads are connected to an outer frame of the lead frame is arranged in a metallic mold, the semiconductor chip being mounted on the tab;

forming the dam member in a linear shape, the dam member traversing each of the groups of leads and being apart from the chip pad supporting leads;

preventing a molding resin by the dam member and the metallic mold from flowing out from the metallic mold; and cutting away, after removal of the metallic mold, the outer frame of the lead frame.

13. A lead frame according to claim 12, wherein the dam member is fabricated by attaching a tape-shaped substance on at least one of two side surfaces of the groups of leads.

14. A lead frame according to claim 12, wherein the dam member is fabricated by dropping or applying a liquid resin compound on an upper surface and spaces between the groups of leads, the dam member traversing the groups of leads and being heated for hardening thereof.

15. A method of fabricating a semiconductor device comprising a tab mounting a semiconductor chip, a lead frame including leads comprising inner leads and outer leads including narrow portions having smaller widths respectively, and a dam member made of an insulating material and disposed only between the outer leads for preventing the insulating material from flowing out, said method comprising the steps of:

mounting the semiconductor chip on the tab;

molding the semiconductor chip and the tab by injecting the insulating material to an inner side of said dam member; and bending the narrow portions of the leads arranged at a position of the dam member for forming the outer leads of the leads.

16. A method of fabricating a semiconductor device comprising a tab mounting a semiconductor chip a lead frame including leads comprising inner leads and outer leads including thick portions having larger thickness, respectively, and a dam member made of an insulating material and disposed only between the outer leads for preventing the insulating material from flowing out, said method comprising the steps of:

mounting the semiconductor chip on the tab;

molding the semiconductor chip and the tab by injecting the insulating material to an inner side of said dam member; and bending the narrow portions of the leads arranged at a position of the dam member for forming the outer leads of the leads.

17. A method of manufacturing a lead frame including an outer frame, a tab for mounting thereon a semiconductor chip, at least two chip pad supporting leads connected to the tab for supporting the tab, groups of leads including inner leads and outer leads with the inner leads not being electrically connected to the tab, and a dam member made of an insulating material and disposed to connect only the outer leads for preventing a sealing resin from flowing out, comprising the steps of mounting the semiconductor chip on the tab; and forming the dam member, the dam member traversing the groups of leads and being apart from the chip pad supporting leads.

18. A method of manufacturing a lead frame including an outer frame, a tab for mounting thereon a semiconductor chip, at least two chip pad supporting leads connected to the tab for supporting the tab, groups of leads including inner leads and outer leads with the inner leads not being electrically connected to the tab, and a dam member made of an insulating material and disposed to connect only the outer leads for preventing a sealing resin from flowing out, with the dam member not connecting any one of the outer frame and the at least two chip pad supporting leads with the outer leads, comprising the steps of mounting the semiconductor chip on the tab; and forming the dam member, the dam member traversing the groups of leads and being apart from the chip pad supporting leads.

19. A method of manufacturing a lead frame including an outer frame, a tab for mounting thereon a semiconductor chip, chip pad supporting leads connected to the tab and the outer frame, groups of leads including inner leads and outer leads, and with the inner leads not being electrically connected to the tab, and a dam member made of an insulting material and disposed to connect only between the outer leads for preventing a sealing resin from flowing out, the method comprising the step of mounting the semiconductor chip on the tab, and forming the dam member, the dam member traversing groups of outer leads extending in a common direction.

20. A method of manufacturing a lead frame including an outer frame, a tab for mounting thereon a semiconductor chip, chip pad supporting leads connected to the tab and the outer frame, groups of leads including inner leads and outer leads, and with the inner leads not being electrically connected to the tab, and a dam member made of an insulting material and disposed to connect only between the outer leads for preventing a sealing resin from flowing out, with the dam member not connecting any one of the outer frame and the at least two chip pad supporting leads with the outer leads, the method comprising the step of mounting the semiconductor chip on the tab, and forming the dam member, the dam member traversing groups of the outer leads extending in a common direction.

21. A method of manufacturing a semiconductor device which utilizes an outer frame, a semiconductor chip mounted on a tab, at least two chip pad supporting leads extend from the tab to the outer frame to support the tab, groups of leads are disposed including inner leads and outer leads with the inner leads not being electrically connected to the tab, a dam member made of an insulating material and disposed only between the outer leads for preventing a sealing resin from flowing out, conducting means connecting each of the groups of leads to the semiconductor chip, wherein portions of each of the groups of leads on a tab side, the tab, the chip pad supporting leads, and the conducting means are sealed with a resin, the method comprising the following steps of:

conducting a resin molding process in which a lead frame in which the chip pad supporting leads and the groups of leads are connected to an outer frame of the lead frame is arranged in a metallic mold, the semiconductor chip being mounted on the tab;

forming the dam member, the dam member traversing each of the groups of leads;

preventing a molding resin by the dam member and the metallic mold from flowing out from the metallic mold; and cutting away, after removal of the metallic mold, the outer frame of the lead frame.

22. A method of manufacturing a semiconductor device which utilizes an outer frame, a semiconductor chip mounted on a tab, at least two chip pad supporting leads extend from the tab to the outer frame to support the tab, groups of leads are disposed including inner leads and outer leads with the inner leads not being electrically connected to the tab, a dam member made of an insulating material and disposed only between the outer leads for preventing a sealing resin from flowing out, with the dam member not connecting any one of the outer frame and the at least two chip pad supporting leads with the outer leads, conducting means connecting each of the groups of leads to the semiconductor chip, wherein portions of each of the groups of leads on a tab side, the tab, the chip pad supporting leads, and the conducting means are sealed with a resin, the method comprising the following steps of:

conducting a resin molding process in which a lead frame in which the chip pad supporting leads and the groups of leads are connected to an outer frame of the lead frame is arranged in a metallic mold, the semiconductor chip being mounted on the tab;

forming the dam member, the dam member traversing each of the groups of leads;

preventing a molding resin by the dam member and the metallic mold from flowing out from the metallic mold; and cutting away, after removal of the metallic mold, the outer frame of the lead frame.

23. A method of fabricating a semiconductor device comprising a tab mounting a semiconductor chip, at least two chip pad supporting leads connected to the tab for supporting the tab, a lead frame including leads comprising inner leads and outer leads including narrow portions having smaller widths respectively, with the inner leads not being electrically connected to the tab, and a dam member made of an insulating material and disposed to connect only the outer leads for preventing the insulating material from flowing out, said method comprising the steps of:

mounting the semiconductor chip on the tab;

molding the semiconductor chip and the tab by injecting the insulating material to an inner side of said dam member; and bending the narrow portions of the leads arranged at a position of the dam member for forming the outer leads of the leads.

24. A method of fabricating a semiconductor device comprising a tab mounting a semiconductor chip, at least two chip pad supporting leads connected to the tab for supporting the tab, a lead frame including leads comprising inner leads and outer leads including narrow portions having smaller widths respectively, with the inner leads not being electrically connected to the tab, and a dam member made of an insulating material and disposed to connect only the outer leads for preventing the insulating material from flowing out, with the dam member not connecting any one of the outer frame and the at least two chip pad supporting leads with the outer leads, said method comprising the steps of:

mounting the semiconductor chip on the tab;

molding the semiconductor chip and the tab by injecting the insulating material to an inner side of said dam member; and bending the narrow portions of the leads arranged at a position of the dam member for forming the outer leads of the leads.

25. A method of fabricating a semiconductor device comprising an outer frame, a tab mounting a semiconductor chip, at least two chip pad supporting leads connected to the tab for supporting the tab, a lead frame including inner leads and outer leads including thick portions having larger thickness, respectively, with the inner leads not being electrically connected to the tab, and a dam member made of an insulting material and disposed to connect only the outer leads for preventing the insulating material from flowing out, said method comprising the steps of:

mounting the semiconductor chip on the tab;

molding the semiconductor chip and the tab by injecting the insulating material to an inner side of said dam member; and bending the thick portions of the leads arranged at a position of the dam member for forming the outer leads of the leads.

26. A method of fabricating a semiconductor device comprising an outer frame, a tab mounting a semiconductor chip, at least two chip pad supporting leads connected to the tab for supporting the tab, a lead frame including inner leads and outer leads including thick portions having larger thickness, respectively, with the inner leads not being electrically connected to the tab, and a dam member made of an insulting material and disposed only between the outer leads for preventing the insulating material from flowing out, with the dam member not connecting any one of the outer frame and the at least two chip pad supporting leads with the outer leads, said method comprising the steps of:

mounting the semiconductor chip on the tab;

molding the semiconductor chip and the tab by injecting the insulating material to an inner side of said dam member; and bending the thick portions of the leads arranged at a position of the dam member for forming the outer leads of the leads.

* * * * *